(12) United States Patent
Lee et al.

(10) Patent No.: US 7,387,906 B2
(45) Date of Patent: Jun. 17, 2008

(54) MULTI-WAVELENGTH SURFACE EMITTING LASER AND METHOD FOR MANUFACTURING THE SAME

(75) Inventors: Eun-kyung Lee, Suwon (KR); Min-hyung Chung, Suwon (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 621 days.

(21) Appl. No.: 10/890,289

(22) Filed: Jul. 14, 2004

(65) Prior Publication Data

US 2004/0258121 A1    Dec. 23, 2004

Related U.S. Application Data

(62) Division of application No. 09/835,319, filed on Apr. 17, 2001, now Pat. No. 6,778,578.

(30) Foreign Application Priority Data

Jul. 20, 2000    (KR)    ................................. 00-41737

(51) Int. Cl.
*H01L 21/00*    (2006.01)
(52) U.S. Cl. .......................................... 438/35
(58) Field of Classification Search .................... 438/35
See application file for complete search history.

(56) References Cited

U.S. PATENT DOCUMENTS 5,699,375 A    12/1997    Paoli
5,729,563 A    3/1998    Wang et al.

(Continued)

FOREIGN PATENT DOCUMENTS

JP    63227089    *    9/1988

(Continued)

OTHER PUBLICATIONS

Yang K et al.: "Monolithic Oxide-Confined Multiple-Wavelength Vertical-Cavity Surface-Emitting Laser Arrays with a 57-nm Wavelength Grading Range Using an Oxidized Upper Bragg Mirror": IEEE Photonics Technology Letters, IEEE Inc. New York, US, vol. 12, No. 4, Apr. 2000; pp. 377-379, XP000950284.

(Continued)

*Primary Examiner*—B. William Baumeister
*Assistant Examiner*—Matthew L. Reames
(74) *Attorney, Agent, or Firm*—Sughrue Mion, PLLC

(57) ABSTRACT

A multi-wavelength surface emitting laser for emitting light having different wavelengths includes a lower reflector, an active layer and an upper reflector which are integrally formed above one substrate. The multi-wavelength surface emitting laser is manufactured by forming a first surface emitting laser, partially removing a first upper reflector, a first active layer, and a first lower reflection layer by etching. A protection film is formed on the outer surface of the first surface emitting laser. A second surface emitting laser is formed by removing a second lower reflector, a second active layer, and a second upper reflection layer formed on the protection film by etching. The protection film is removed and first and second upper electrodes are formed on upper surfaces of the first and second upper reflection layers, respectively, and a lower electrode is formed on a bottom surface of the substrate.

7 Claims, 4 Drawing Sheets

U.S. PATENT DOCUMENTS

| | | |
|---|---|---|
| 6,021,146 A | 2/2000 | Jiang et al. |
| 6,546,035 B2 * | 4/2003 | Imafuji et al. ............ 372/50.12 |
| 6,560,262 B1 * | 5/2003 | Alam et al. ................ 372/50.1 |

FOREIGN PATENT DOCUMENTS

| | | |
|---|---|---|
| JP | 04-002189 | 1/1992 |
| JP | 06-302901 | 10/1994 |
| JP | 07-312462 | 11/1995 |
| JP | 10-233559 | 9/1998 |
| JP | 10-270799 | 10/1998 |
| JP | 2000011417 * | 1/2000 |

OTHER PUBLICATIONS

Koyama F et al.; :Two-dimensional mutliwavelength surface emitting laser arrays fabricated by nonplanar MOCVD: Electronics Letters, IEE Stevenage, GB, vol. 30, No. 23, Nov. 10, 1994; pp. 1947-1948; XP006001296.

Wipiejewski T. et al.: "Multiple wavelength vertical-cavity laser array employing molecular beam epitaxy regrowth": Electronics Letters, IEE Stevenage, GB, vol. 32, No. 4, Feb. 15, 1996; pp. 340-342, XP006004708.

* cited by examiner

MULTI-WAVELENGTH SURFACE EMITTING LASER AND METHOD FOR MANUFACTURING THE SAME

This is a divisional of application Ser. No. 09/835,319 filed Apr. 17, 2001 now U.S. Pat. No. 6,778,578; the disclosure of which is incorporated herein by reference.

BACKGROUND OF THE INVENTION

1. Field of the Invention

The present invention relates to a surface emitting laser which can emit laser beams in a direction perpendicular to a substrate, and more particularly, to a multi-wavelength surface emitting laser in which different types of surface emitting lasers emitting laser beams of different wavelengths are configured on the same substrate, and a method for manufacturing the same.

The present invention is based upon Korean Patent Application No. 00-41737, filed Jul. 20, 2000, which is incorporated herein by reference.

2. Description of the Related Art

In general, a surface emitting laser emits a laser beam in a direction normal to the surfaces of deposited semiconductor material layers, which is different from an edge emitting laser. Also, since the surface emitting laser emits a circular beam, unlike the edge emitting laser, an optical system is not needed to correct the cross-sectional shape of an emitted beam. Also, the surface emitting laser can be manufactured in a compact size, and a plurality of surface emitting lasers can be integrated on a single semiconductor substrate, thus enabling a two-dimensional arrangement. As a result, the surface emitting laser has a wide range of optical application fields such as electronic calculators, audio-visual apparatuses, laser printers, laser scanners, medical equipment, and communications apparatuses.

Referring to FIG. 1, a conventional surface emitting laser includes a substrate 10, a lower reflector 12, an active layer 14 and an upper reflector 16, which are deposited in order on the substrate 10.

The substrate 10 is formed of a semiconductor material such as gallium arsenide (GaAs) or indium phosphorous (InP) including a predetermined impurity, for example, an n-type impurity. The lower and upper reflectors 12 and 16 are distributed Bragg reflectors (DBRs) formed by alternately depositing pairs of semiconductor layers having different refractive indices. That is, the lower reflector 12 is formed on the substrate 10 and is formed of the same type of impurity as that of the substrate 10, for example, n-type $Al_xGa_{1-x}As$ and AlAs are alternately deposited. The upper reflector 16 is formed of the same semiconductor material as that of the lower reflector 12 and includes a semiconductor material with the opposite type of charge carriers to that of the lower reflector 12. For example, p-type $Al_xGa_{1-x}As$ and AlAs are alternately deposited. The active layer 14 has a single or multi-quantum well structure or a super lattice structure as an area for generating a light beam when energy transition is generated due to recombination of electrons and holes. An upper electrode 23 having a window 23a is provided on the upper surface of the upper reflector 16 and a lower electrode 21 is provided on the bottom surface of the substrate 10.

Also, to improve the output of light L emitted through the window 23a, a high resistance portion 18 is formed by injecting protons into the upper reflector 16 except for a zone under the window 23a. Accordingly, the high resistance portion 18 limits the flow of holes so that laser oscillation is generated only in the zone under the window 23a.

In the surface emitting laser having the above structure, the wavelength of a laser beam is determined by the materials of the upper and lower reflectors 16 and 12, the structure of deposition, and the structure of the active layer 14. Thus, when the surface emitting laser is manufactured in a single process with a single substrate, it is difficult to produce the surface emitting laser in an array form so as to emit laser beams of different wavelengths.

Also, in application fields of a semiconductor laser capable of emitting laser beams having different wavelengths, such as compatible optical pickups for DVD players which can also read CDs, and communications equipment in which the wavelengths for transmitting and receiving are different, a structure in which surface emitting lasers, which are manufactured to correspond to desired wavelengths, and are attached to an additional substrate, has been suggested. However, the above structure has a problem in that it generates a large optical alignment error due to an error in the combination of the respective surface emitting lasers.

SUMMARY OF THE INVENTION

To solve the above problems, it is an object of the present invention to provide a multi-wavelength surface emitting laser, and method of manufacturing the same, formed directly on a single substrate so that optical alignment errors are reduced and manufacturing is made easy.

Accordingly, to achieve the above object, there is provided a multi-wavelength surface emitting laser for emitting light having a first wavelength and light having a second wavelength. The multi-wavelength laser comprises a substrate, a first surface emitting laser for emitting light having a first wavelength, which is directly formed on a portion of an upper surface of the substrate. The first surface emitting laser includes a first lower reflector formed by alternately depositing two semiconductor material layers with the same type of impurities, but different refractive indices. A first active layer is provided. A first upper reflector is formed by depositing two semiconductor material layers having different refractive indices and the opposite type of impurities to that of the first lower reflector. Also provided is a second surface emitting laser for emitting light having a second wavelength, which is directly formed on a portion of an upper surface of the substrate neighboring the first surface emitting laser. The second surface emitting laser includes a second lower reflector formed by alternately depositing two semiconductor material layers having different refractive indices and the same type of impurities. A second active layer is provided. A second upper reflector is formed by depositing two semiconductor material layers having different refractive indices and the opposite type of impurities to that of the second lower reflector. A lower electrode layer is formed on one surface of the substrate, and first and second upper electrodes are formed on the first and second upper reflectors, respectively, for applying electric power.

Also, to achieve another aspect of the above object, there is provided a method for manufacturing a multi-wavelength surface emitting laser comprising the steps of forming a first surface emitting laser for emitting light having a first wavelength by sequentially depositing on a prepared substrate a first lower reflector formed by alternately depositing two semiconductor material layers with the same type of impurities, but different refractive indices, a first active layer, and a first upper reflector formed by alternately depositing two semiconductor material layers having the opposite type of impurities to that of the first lower reflector and different refractive indices. The method also includes partially removing the first upper reflector, the first active layer, and the first lower reflection layer by etching, and forming a protection film on the outer surface of the first surface emitting laser. A second surface emitting laser for emitting light having a second wavelength is formed by sequentially depositing on the substrate and the protection film, a second lower reflector formed by alternately depositing two semiconductor material layers having the same type of impurities, but different refractive indices, a second active layer, and a second upper reflector formed by alternately depositing two semiconductor material layers having the opposite type of impurities to that of the second lower reflector and different refractive indices. The method further includes removing the second lower reflector, the second active layer, and the second upper reflection layer formed on the protection film by etching, and removing the protection film and forming first and second upper electrodes on upper surfaces of the first and second upper reflection layers, respectively, and a lower electrode on a bottom surface of the substrate.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

Figure 1:
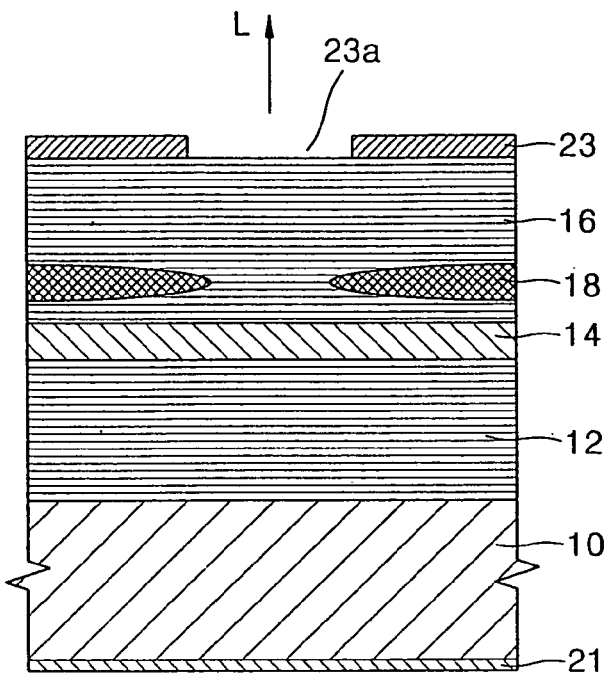
FIG. 1 is a sectional view showing a conventional surface emitting laser.
Figure 2:
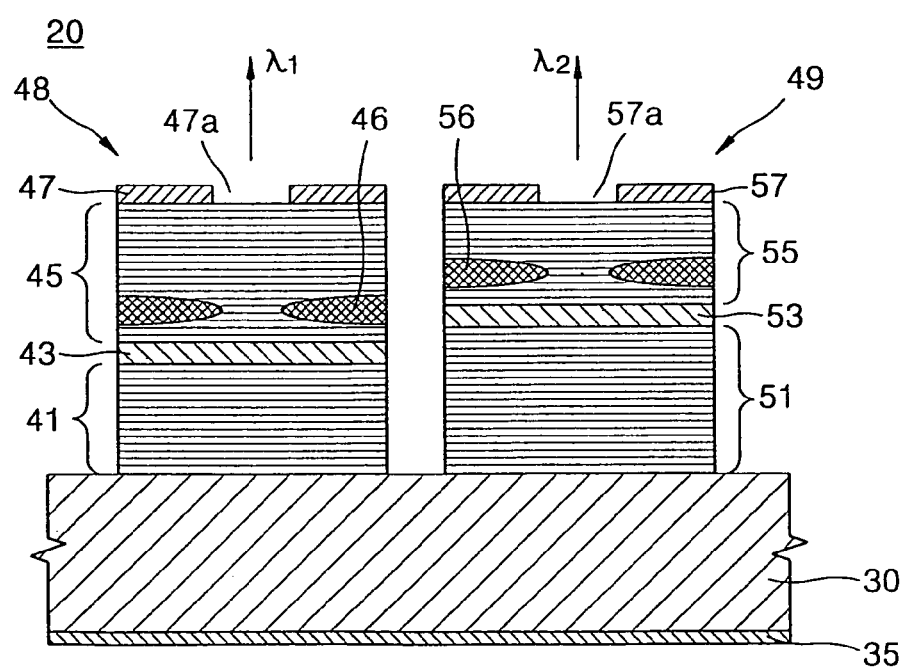
FIG. 2 is a sectional view showing a multi-wavelength surface emitting laser according to a preferred embodiment of the present invention.

Referring to FIG. 2, a multi-wavelength surface emitting laser 20 according to a preferred embodiment of the present invention includes a substrate 30, and a first surface emitting laser 48 and a second surface emitting laser 49 provided on the substrate 30 for emitting laser beams having different wavelengths $\lambda_1$ and $\lambda_2$. Also, a lower electrode 35 is formed on the bottom surface of the substrate 30. A first upper electrode 47 and a second upper electrode 57 are formed on the upper surfaces of the first and second surface emitting lasers 48 and 49, respectively. Here, the first and second upper electrodes 47 and 57 have first and second windows 47a and 57a, respectively.

The substrate 30 is formed of a semiconductor material such as gallium arsenide (GaAs) or indium phosphorous (InP) including an n-type impurity.

The first surface emitting laser 48 emits a laser beam having the first wavelength $\lambda_1$ and includes a first lower reflector 41, a first active layer 43 and a first upper reflector 45, which are deposited in order on the substrate 30. The first lower reflector 41 is a distributed Bragg reflector (DBR) which is formed by alternately depositing pairs of impurity doped semiconductor layers having different refractive indices. The first lower reflector 41 is formed by alternately depositing n-type $Al_xGa_{1-x}As$ and AlAs, which has the same impurity as the substrate 30. The first upper reflector 45 is a DBR formed by alternately depositing pairs of impurity doped semiconductor materials having different refractive indices, and the opposite type of impurities to that of the first lower reflector 41, for example, p-type $Al_xGa_{1-x}As$ and AlAs.

The first active layer 43 has a single or multi-quantum well structure or a super lattice structure. The first active layer 43 is an area in which, when current is applied to the first upper electrode 47 and the lower electrode 35, holes and electrons generated by the first upper reflector 45 and the first lower reflector 41, respectively are re-combined. The first active layer 43 emits a laser beam due to energy transition according to the combination of the electrons and the holes. To improve the output of light having the first wavelength $\lambda_1$ emitted through the first window 47a, it is preferable to further provide a first high resistance portion 46 by injecting protons into the first upper reflector 45 except for a zone under the window 47a. Thus, since the flow of current is limited by the first high resistance portion 46, light is emitted only from under the first window 47a. Here, the first high resistance portion 46 can be manufactured by an oxidation process, instead of the above-described proton injection method. The wavelength of the light emitted from the first surface emitting laser 48 is determined by the structure of the first upper reflector 45 and the first lower reflector 41 and the structure of the first active layer 43.

The second surface emitting laser 49 emits a laser beam having the second wavelength $\lambda_2$ and includes a second lower reflector 51, a second active layer 53, and a second upper reflector 55 which are deposited in order on the substrate 30. The second lower reflector 51 is a distributed Bragg reflector (DBR) which is formed by alternately depositing pairs of impurity doped semiconductor layers having different refractive indices. The second upper reflector 55 is also a DBR formed by alternately depositing pairs of impurity doped semiconductor layers having different refractive indices and an opposite semiconductor type to that of the second lower reflector 51.

The second active layer 53 is an area where holes and electrons generated by the second upper reflector 55 and the second lower reflector 51, respectivley, are re-combined when current is applied to the second upper electrode 57 and the lower electrode 35. A laser beam is generated from the second active layer 53 due to energy transition according to the combination of the electrons and holes. To improve the output of light of the second wavelength $\lambda_2$ emitted through the second window 57a, a second high resistance portion 56 is provided, which is formed by injecting protons into the second upper reflector 55, except for a zone under the second window 57a. Since the second high resistance portion 56 limits the flow of current, light is generated and emitted only from the zone under the second window 57a. Here, the second high resistance portion 56 can be manufactured by an oxidation process instead of the above-described proton injection method. The wavelength of the light emitted from the second surface emitting laser 49 having the above structure is determined by the structure of the second upper reflector 55 and the second lower reflector 51 and the structure of the second active layer 53. Also, the respective heights of the second upper reflector 55, the second lower reflector 51, and the second active layer 53 are set to be different from those of the first surface emitting laser 48.

The method for manufacturing the multi-wavelength surface emitting laser having the above structure will be described with reference to FIGS. 3A through 3F.

Figure 3A:
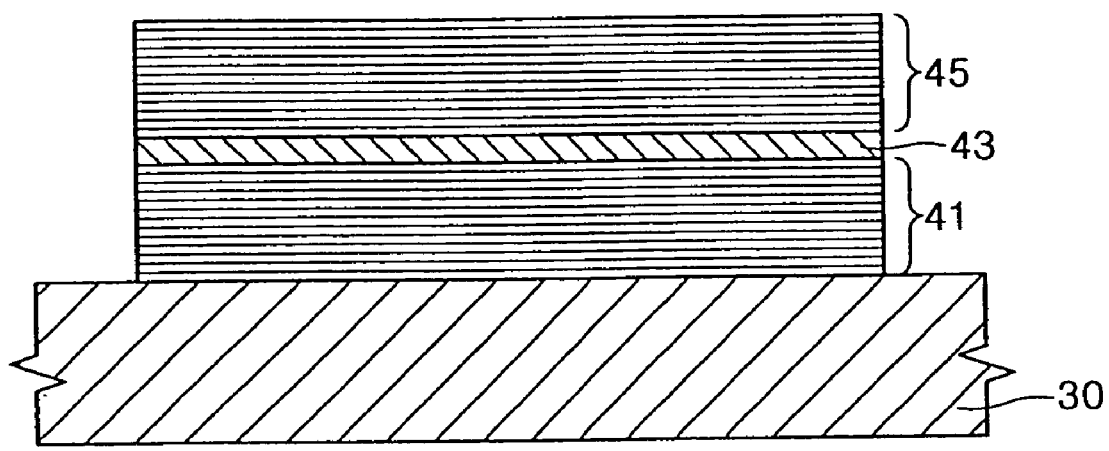
FIGS. 3A through 3F are sectional views showing the surface emitting laser at progressive stages leading to the completion of the invention, for explaining a method for manufacturing the multi-wavelength surface emitting laser according to a preferred embodiment of the present invention.
Figure 3B:
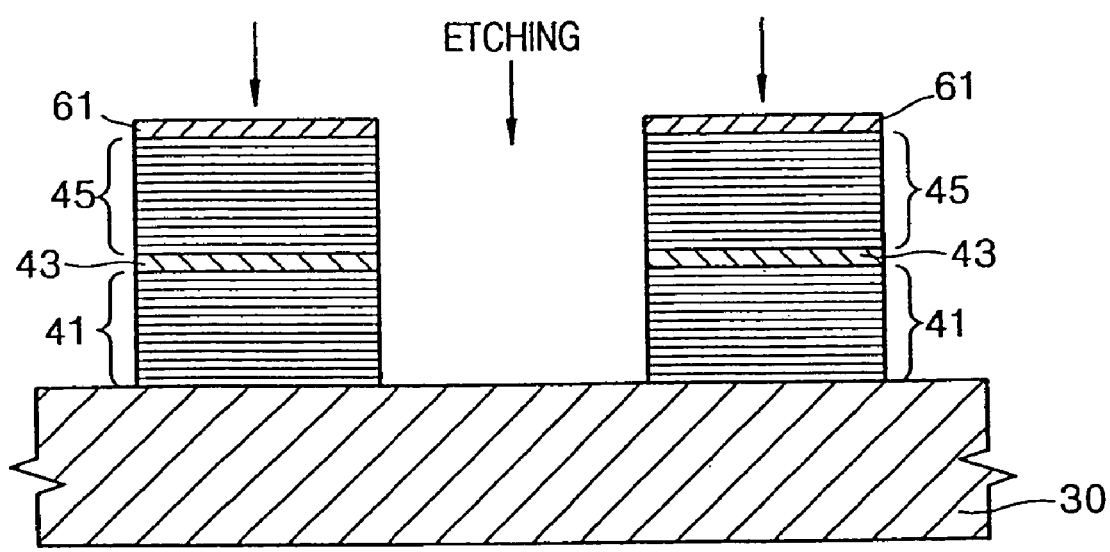

Referring to FIG. 3A, a substrate 30 is prepared and a first surface emitting laser 48 having a structure suitable for emitting light having the first wavelength $\lambda_1$ is formed on the substrate 30. The first surface emitting laser 48 is formed by depositing the first lower reflector 41, the first active layer 43, and the first upper reflector 45 in order on the substrate 30. The first lower reflector 41 is formed by alternately depositing two semiconductor material layers with the same type of impurities, but different refractive indices, while the first upper reflector 45 is formed by alternately depositing two semiconductor material layers having different refractive indices and the opposite type of impurities to that of the first lower reflector 41. Here, the first surface emitting laser 48 is manufactured by growing a desired semiconductor material on the substrate 30 by an epitaxial growth method using semiconductor equipment such as metal organic chemical vapor deposition (MOCVD) equipment or molecular beam epitaxial (MBE) equipment. Here, instead of the epitaxial growth method, the first upper reflector 45 can be manufactured as a dielectric mirror formed of a dielectric such as $SiO_2$ or $TiO_2$.

Next, part of the first surface emitting laser 48 is removed so that part of the upper surface of the substrate 30 can be exposed. A second surface emitting laser 49 for emitting light having the second wavelength $\lambda_2$ is formed in the area where part of the first surface emitting laser was removed. That is, referring to FIG. 3B, a first etching mask 61 having a predetermined pattern is disposed on the first upper reflector 45. Then, by performing etching, for example, by a dry etching method, parts of the first upper reflector 45, the first active layer 43, and the first lower reflector 41 located in a predetermined area are removed.

Figure 3C:
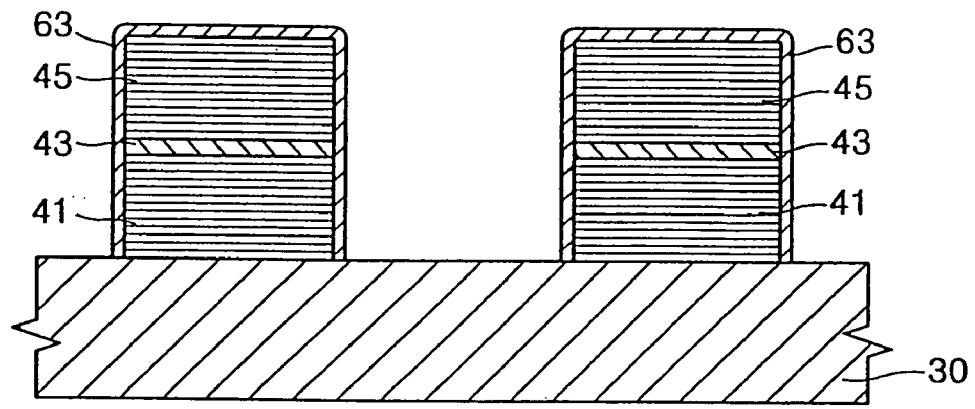

Next, as shown in FIG. 3C, after the first etching mask 61 is removed, a protection film 63 for enclosing the first surface emitting laser 48 is formed. The protection film 63 is formed of silicon nitride or silicon oxide. The protection film 63 is used to facilitate removal of an unnecessary portion growing on the upper surface of the first surface emitting laser 48 when a second surface emitting laser 49 is formed in a process which will be described later. The protection film 63 also protects the first surface emitting laser 48 having completed its growth in a subsequent process.

Figure 3D:
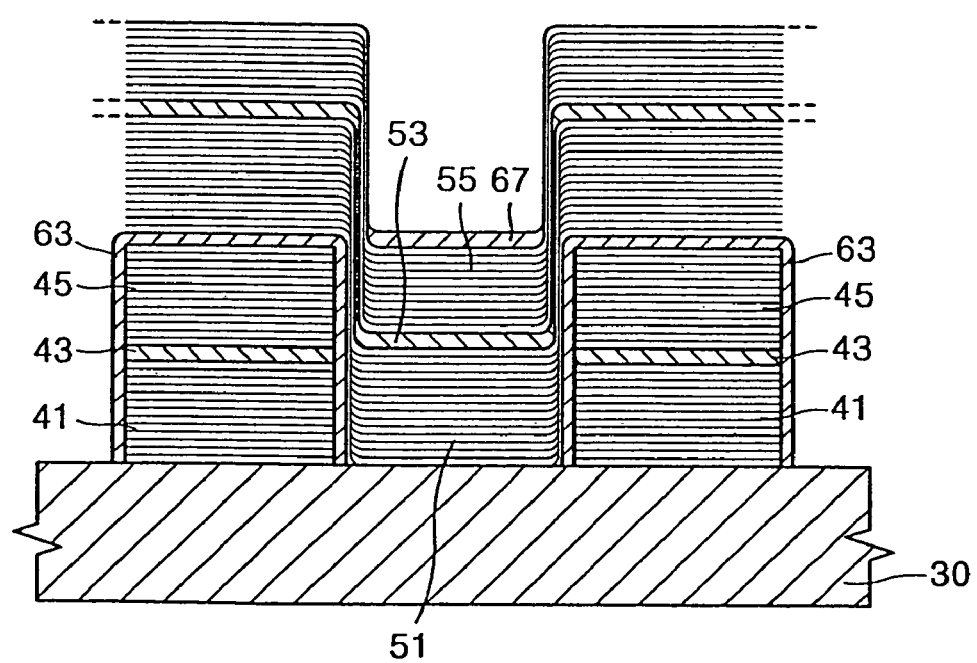

Then, as shown in FIG. 3D, the second surface emitting laser 49 is formed on the substrate 30 and the protection film 63. The second surface emitting laser 49 for emitting light having the second wavelength $\lambda_2$ is formed by depositing the second lower reflector 51, the second active layer 53, and the second upper reflector 55 in order on the substrate 30. The second lower reflector 51 is formed by alternately depositing two semiconductor material layers with the same type of impurities, but different refractive indices, while the second upper reflector 55 is formed by alternately depositing two semiconductor material layers having different refractive indices and the opposite type of impurities to that of the second lower reflector 51. The second surface emitting laser 49 is preferably grown by the epitaxial growth method with the same semiconductor equipment used for the first surface emitting laser 48. Next, a second etching mask 67 is partially provided on the upper surface of the second upper reflector 55, as shown in FIG. 3D, so that the remaining portion, except for part of the second surface emitting laser 49, formed neighboring the first surface emitting laser 48, can be removed.

Figure 3E:
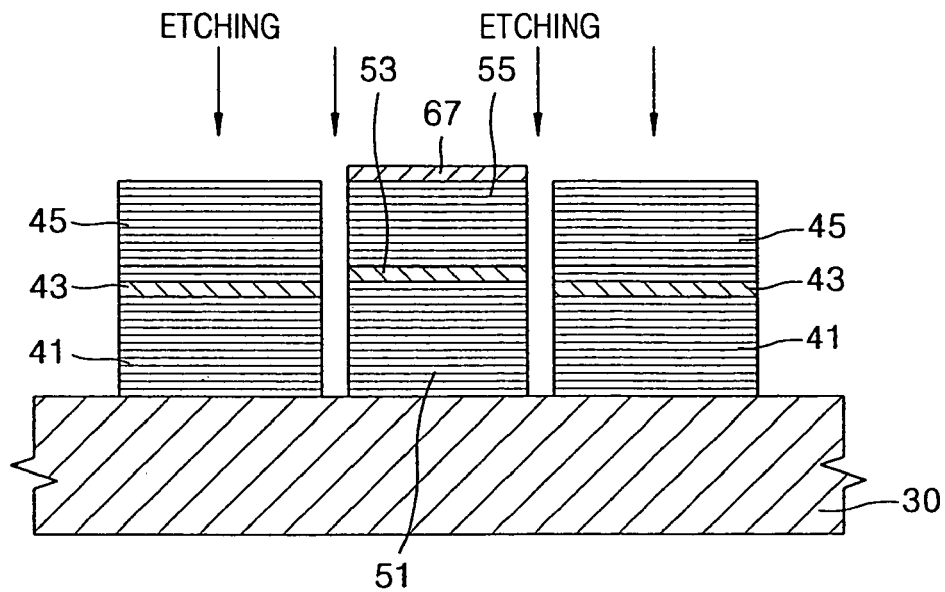

As shown in FIG. 3E, the remaining second surface emitting laser, except for an area under the second etching mask 67, is removed by etching. Then, the protection layer 63 is removed.

Figure 3F:
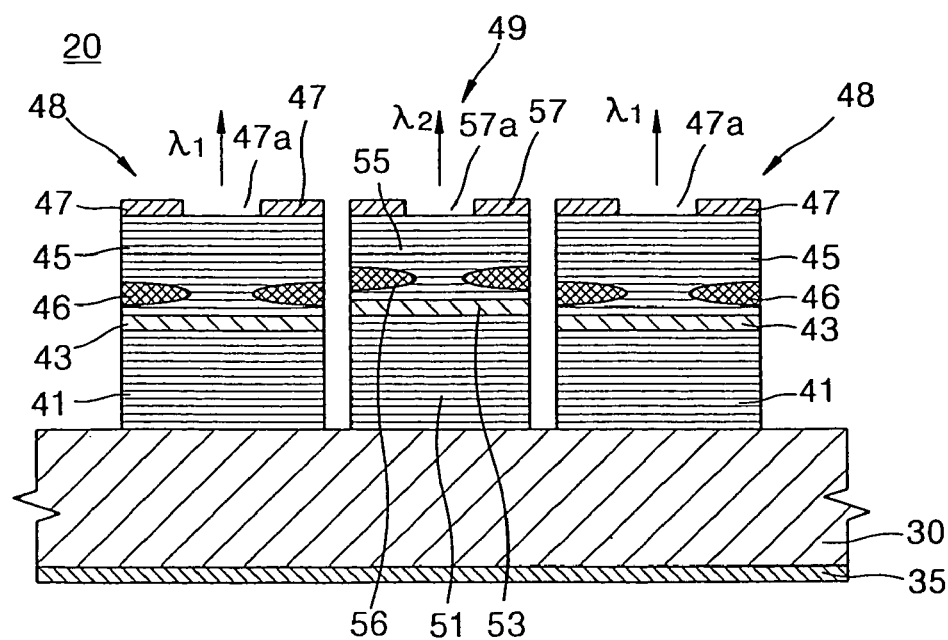

Finally, as shown in FIG. 3F, after the second etching mask 67 is removed, the first and second upper electrodes 47 and 57, on which the first and second windows 47a and 57a for emitting light are provided, are formed on the upper surfaces of the first and second upper reflectors 45 and 55. The lower electrode 35 is formed on the bottom surface of the substrate 30 and, thus, the multi-wavelength surface emitting laser 20 is completely manufactured.

Preferably, a step for partially forming the first and second high resistance portions 46 and 56 by the proton injection process or the oxidation process in each of the first and second upper reflectors 45 and 55 is performed before the first and second upper electrodes 47 and 57 are formed.

As described above, in the multi-wavelength surface emitting laser manufactured according to the preferred embodiment of the present invention, since light having different wavelengths can be simultaneously emitted from a single substrate, optical alignment is easy in comparison to a method in which surface emitting lasers, manufactured by an additional process, are attached to a substrate. Also, since the first and second surface emitting lasers are manufactured in consecutive processes, the manufacturing process thereof is simple.

It is contemplated that numerous modifications may be made to the apparatus and method of the present invention without departing from the spirit and scope of the invention as defined in the claims.

What is claimed is:

1. A method for manufacturing a multi-wavelength surface emitting laser comprising the steps of:

forming a first surface emitting laser which emits light having a first wavelength, the forming of the first surface emitting laser including,
depositing, sequentially, on a prepared substrate a first lower reflector, a first active layer and a first upper reflector, the first lower reflector formed by;
depositing, alternately, two semiconductor material layers having a same type of impurity, but different refractive indices, the first upper reflector formed by;
depositing, alternately, two semiconductor material layers having an opposite type of impurity to that of the first lower reflector and having different refractive indices;
partially removing the first upper reflector, the first active layer, and the first lower reflection layer by etching; and
forming a protection film on an outer surface of the first surface emitting laser;

forming a second surface emitting laser which emits light having a second wavelength, the forming of the second surface emitting laser including,
depositing, sequentially, on the substrate and the protection film, a second lower reflector, a second active layer, and a second upper reflector, the second lower reflector formed by;
depositing, alternately two semiconductor material layers having a same type of impurity, but different refractive indices, the second upper reflector formed by;
depositing, alternately, two semiconductor material layers having an opposite type of impurity to that of the second lower reflector and different refractive indices;
removing portions of the second lower reflector, the second active layer, and the second upper reflection layer formed on the protection film by etching; and
removing the protection film; forming a first upper electrode on an upper surface of the first upper reflection layer;

forming a second upper electrode on an upper surface of the second upper reflection layer; and forming a lower electrode on a bottom surface of the substrate.

2. The method as claimed in claim 1, wherein the protection film is formed of one selected from a group consisting of silicon nitride and silicon oxide.

3. The method as claimed in claim 1, further comprising a step of forming first and second high resistance portions by injecting protons into part of the first and second upper reflectors before the first and second upper electrodes are formed.

4. A method for manufacturing a multi-wavelength surface emitting laser comprising the steps of:
   forming a first surface emitting laser which emits light having a first wavelength, on a substrate; and
   forming a second surface emitting laser which emits light having a second wavelength on the substrate, wherein the first surface emitting laser is formed by:
   depositing, sequentially, on the substrate a first lower reflector, a first active layer and a first upper reflector, and wherein the second surface emitting laser is formed by:
   forming a protection film on an outer surface of the first surface emitting laser; and
   depositing, sequentially, on the substrate and the protection film, a second lower reflector, a second active layer, and a second upper reflector.

5. The method as claimed in claim 4, wherein the first lower reflector is formed by,
   depositing, alternately, two semiconductor material layers having a same type of impurity, but different refractive indices, and wherein the first upper reflector is formed by;
   depositing, alternately, two semiconductor material layers having an opposite type of impurity to that of the first lower reflector and having different refractive indices, and wherein the second lower reflector is formed by;
   depositing, alternately two semiconductor material layers having a same type of impurity, but different refractive indices, and wherein the second upper reflector formed by;
   depositing, alternately, two semiconductor material layers having an opposite type of impurity to that of the second lower reflector and different refractive indices.

6. The method as claimed in claim 4, further including,
   removing portions of the second lower reflector, the second active layer, and the second upper reflection layer formed on the protection film by etching; and removing the protection film.

7. The method as claimed in claim 6, further including;
   forming a first upper electrode on an upper surface of the first upper reflection layer;
   forming a second upper electrode on an upper surface of the second upper reflection layer; and
   forming a lower electrode on a bottom surface of the substrate.

* * * * *